Sept. 10, 1963 J. C. LOGUE 3,103,595
COMPLEMENTARY TRANSISTOR BISTABLE CIRCUIT
Filed Sept. 26, 1955
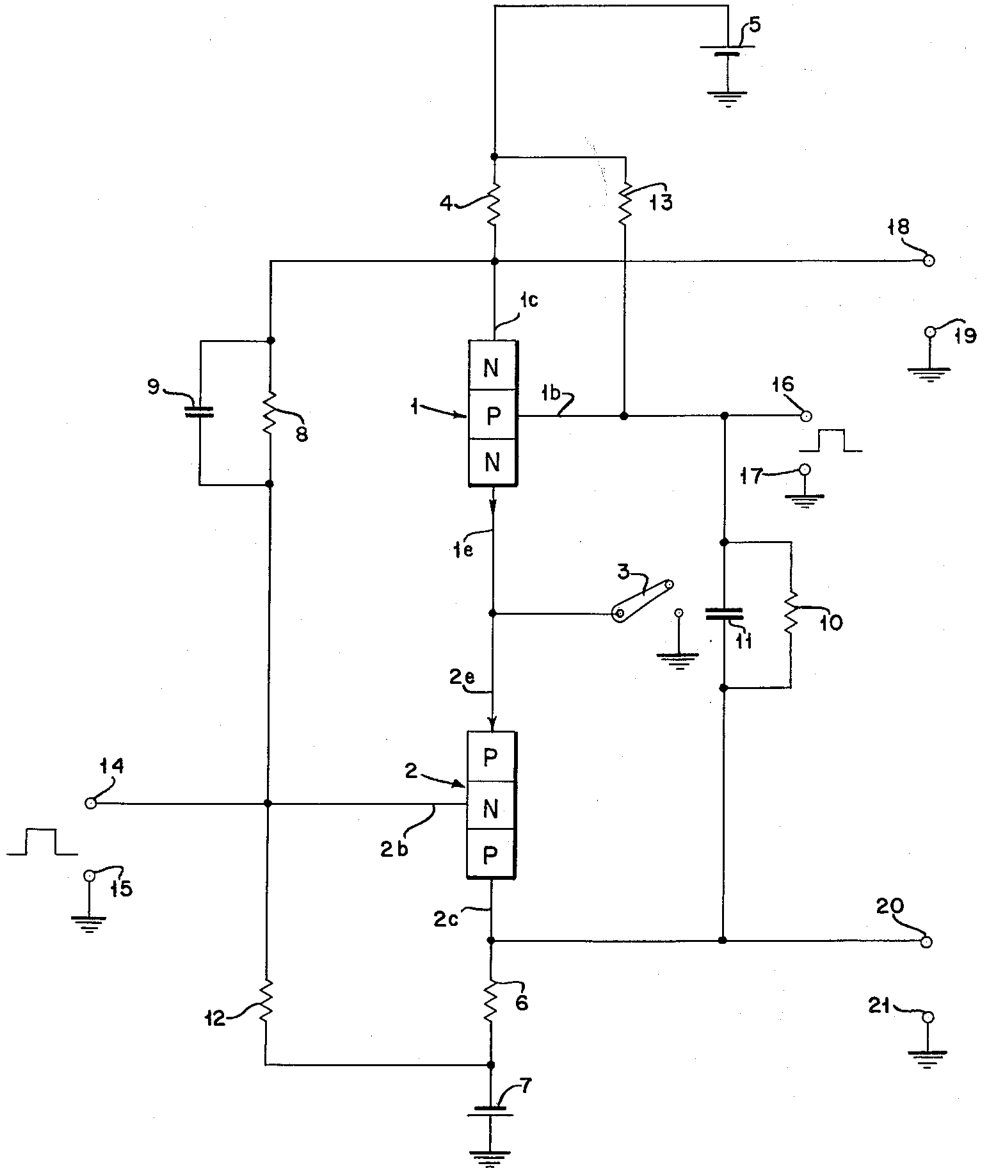
*INVENTOR.*
JOSEPH C. LOGUE
*BY* [signature]
ATTORNEY United States Patent Office 3,103,595

Patented Sept. 10, 1963

3,103,595
COMPLEMENTARY TRANSISTOR BISTABLE CIRCUIT

Joseph C. Logue, Poughkeepsie, N.Y., assignor to International Business Machines Corporation, New York, N.Y., a corporation of New York Filed Sept. 26, 1955, Ser. No. 536,376
4 Claims. (Cl. 307—88.5)

This invention relates to bistable circuits, such as are used as triggers, latches, and the like, and is particularly concerned with bistable circuits employing transistors as translating devices.

There is disclosed in the copending application of Robert A. Henle, Serial No. 399,093, filed December 18, 1953 (IBM Dkt. 4374), a bistable circuit employing complementary junction transistors, i.e., an NPN junction transistor and a PNP junction transistor. The present invention is an improvement on the circuit disclosed in the Henle application. In particular, it is improved in that complementary outputs are obtainable from different points in the circuit. It is further improved in that it has very definite On and Off levels. Furthermore, in one modification, the complementary characteristics of the two transistors are employed to compensate for variations in the transistor characteristics, so that transistors having considerable differences between their respective characteristics may be used interchangeably in the present circuit.

An object of the present invention is to provide an improved bistable circuit.

Another object is to provide an improved bistable circuit employing complementary transistors.

The foregoing and other objects of the invention are attained in the circuits described herein by connecting directly together the emitters of two complementary junction transistors, providing separate load branch circuits with oppositely polarized batteries for the collectors of the two transistors, and providing cross-feedbacks between the collector of each transistor and the base of the other transistor. Signal inputs are connected to the bases and signal outputs to the collectors of the two transistors.

Other objects and advantages of the invention will become apparent from a consideration of the following description and claims taken together with the accompanying drawing, in which:

The single FIGURE represents a wiring diagram of a bistable circuit embodying the invention.

The circuit includes an NPN junction transistor 1 having an emitter 1*e*, a base 1*b* and a collector 1*c*, and a PNP transistor having an emitter 2*e*, a base 2*b* and a collector 2*c*. The emitters 1*e* and 2*e* are connected directly together. They may be connected to ground through a switch 3.

Collector 1*c* is connected through a load resistor 4 and a battery 5 to ground. The positive terminal of battery 5 is connected to resistor 4 and its negative terminal is grounded. Collector 2*c* is connected through a load resistor 6 and a battery 7 to ground. The negative terminal of battery 7 is connected to resistor 6 and its positive terminal is grounded.

Cross-coupling is provided between collector 1*c* and base 2*b* through a resistor 8 and a parallel capacitor 9. Cross-coupling is provided between collector 2*c* and base 1*b* through a resistor 10 and a parallel capacitor 11.

A resistor 12 is connected between base 2*b* and the negative terminal of battery 7. The resistor 12 cooperates with resistor 8 to form a voltage divider between collector 1*c* and battery 7, which voltage divider determines the potential of base 2*b*, by determining the proportion of the total output signal at collector 1*c* which is effective at base 2*b*.

A resistor 13 is connected between base 1*b* and the positive terminal of battery 5. The resistor 13 cooperates with resistor 10 to form a voltage divider between collector 2*c* and battery 5, which voltage divider determines the proportion of the total output signal at collector 2*c* which is coupled back to base 1*b*.

An input terminal 14 is connected to base 2*b*, and a cooperating input terminal 15 is grounded. Another input terminal 16 is connected to base 1*b* and a cooperating input terminal 17 is grounded. An output terminal 18 is connected to collector 1*c* and a cooperating output terminal 19 is grounded. A complementary output terminal 20 is connected to collector 2*c* and a cooperating output terminal 21 is grounded.

*Operation*

In the operation of this circuit, both transistors are On or Off together. Let us assume initially that both are On and that switch 3 is closed, grounding the two emitters. Under these conditions, both collectors are close to ground potential, since both transistors are in their low impedance condition. The resistors 12 and 13 now supply bias currents from the batteries 7 and 5 respectively to the bases of the two transistors, which currents are sufficient to keep the transistors conducting.

If a positive-going input signal pulse is now applied to input terminal 14, base 2*b* will be swung positive with respect to grounded emitter 2*e* and transistor 2 will be cut Off. The collector 2*c* will drop from a potential near ground to substantially the potential of the negative terminal of battery 7. A negative-going pulse is thereby produced at collector 2*c*, which pulse is transmitted through capacitor 11 and resistor 10 to the base 1*b* of transistor 1. This negative pulse is effective to turn the transistor 1 Off. The potential of collector 1*c* then rises from a value near ground to substantially the potential of the positive terminal of battery 5. A positive-going pulse is thereby produced at collector 1*c*, which pulse is coupled through capacitor 9 and resistor 8 to the base 2*b* of transistor 2, where it is effective to hold the transistor Off. During the cross-coupling feedback operation, the resistors 8 and 12 act as a voltage divider to determine the proportion of the total signal at collector 1*c* which is coupled back to the base 2*b*. Resistors 10 and 13 similarly cooperate as a voltage divider.

Complementary output signals are available at terminals 18 and 20. The signal at terminal 20 is a negative-going output signal in response to a positive-going input signal at input terminal 14. A positive-going output signal is produced at output terminal 18 in response to the same positive-going input signal.

A positive-going input signal at terminal 14 is effective to switch the two transistors from their On condition to their Off condition as described above. Once the transistors are switched Off, they may be restored to their On condition by a positive-going input signal at terminal 16. Alternatively, they may be switched On by a negative-going input signal at terminal 14. They may also be switched Off by a negative-going input signal at terminal 16.

Where the circuit is operated by input signals at two sets of input terminals, it is termed a latch circuit, and where it is operated by signals at a single input terminal, it is termed a trigger circuit.

If the emitters 1 and 2 are not connected to ground, i.e., if the switch 3 is open, then the current through the two transistors must be the same. If the transistors do not have exactly the same characteristics, then the two emitters will assume a potential different from ground as required to make the two currents the same. This potential may vary between the On and Off conditions of the two transistors.

For example, assume that the transistor 1 tends to have a lower impedance than the transistor 2 when both transistors are On. Consider the voltage divider action between the positive terminal of battery 5 through resistor 4, transistors 1 and 2 and the resistor 6 to the negative terminal of battery 7. Since there is less impedance between the emitters and the battery 5 than there is between the emitters and battery 7, the emitters will have a potential more positive than the median potential, i.e., ground. This more positive potential on emitter 1*e* will tend to reduce the current flow through it, and will tend to increase the current flow through transistor 2. The emitter potential will continue to swing positive from ground until it effects a balance between the characteristics of the two transistors. It will not swing very far from ground, even under the worst conditions of unbalance, since the impedances of the resistors 4 and 6 are considerably greater than the impedances of the transistors 1 and 2. Furthermore, although the emitters may be at a potential slightly different from ground, this will not affect the mode of bistable operation described above, in which it was assumed that the emitters were connected to ground.

While I have shown and described a preferred embodiment of my invention, other modifications thereof will readily occur to those skilled in the art, and I therefore intend my invention to be limited only by the appended claims.

I claim:

1. A bistable circuit comprising an NPN junction transistor, a PNP junction transistor, each said transistor comprising an emitter, a collector and a base, means directly connecting said emitters conductively, a first load branch circuit connected to the collector of the NPN transistor and comprising in series a resistor and a first source of electrical energy having its positive terminal connected to said resistor, a second load branch circuit connected to the collector of the PNP transistor and comprising in series a second resistor and a second source of electrical energy having its negative terminal connected to said resistor, first and second cross-coupling impedance means connecting the respective collectors to the bases of the opposite transistors, third and fourth resistors connecting the respective bases to the terminals of said first and second sources nearest the respective collectors, each of said third and fourth resistors cooperating with the one of said cross-coupling means connected to its associated base, to control the potential of said base in the absence of an input signal at said base, and at least one signal input connected to one of the bases and adapted to produce a signal current pulse of limited duration, both transistors being maintained in a stable state of conductivity determined by said input signal current pulse even after said input signal pulse terminates.

2. A bistable circuit comprising an NPN junction transistor, a PNP junction transistor, each transistor comprising an emitter, a collector and a base, means directly and conductively connecting said emitters externally only to each other, a first load branch circuit connected to the collector of the NPN transistor and comprising in series a resistor and a first source of electrical energy having its positive terminal connected to said resistor, a second load branch circuit connected to the collector of the PNP transistor and comprising in series a second resistor and a second source of electrical energy having its negative terminal connected to said resistor, first and second cross-coupling impedance means connecting the respective collectors to the bases of the opposite transistor, and at least one signal input connected to one of the bases and adapted to produce a signal current pulse of limited duration, both transistors being maintained in a stable state of conductivity determined by said input signal current pulse even after said input signal pulse terminates.

3. A multivibrator comprising a PNP transistor and an NPN transistor each having emitter, base and collector; a source of direct-current potential; means for connecting said source to bias the emitter of said PNP transistor positive relative to its base; means for connecting said source to bias the emitter of said NPN transistor negative relative to its base; capacitive means coupling the base of each transistor to the collector of the other; resistance means connecting the base of each transistor to its own collector; and output means connected to the collector of at least one of the transistors.

4. A multivibrator circuit comprising a PNP junction transistor and an NPN junction transistor each having emitter, base and collector; a source of direct-current potential connected to bias the emitter-base junction of each transistor in a low-resistance direction and to bias the collector-base junction of each transistor in a high-resistance direction; means providing an alternating-current connection between the base of each transistor and the collector of the other; means providing a resistive connection from the base of each transistor to its own collector; and a signal output circuit connected to the collector of at least one of the transistors.

References Cited in the file of this patent

UNITED STATES PATENTS

| | | |
|---|---|---|
| 2,569,345 | Shea | Sept. 25, 1951 |
| 2,641,717 | Toth | June 9, 1953 |
| 2,655,609 | Shockley | Oct. 13, 1953 |
| 2,663,800 | Herzog | Dec. 22, 1953 |
| 2,744,198 | Raisbeck | May 1, 1956 |
| 2,788,449 | Bright | Apr. 9, 1957 |